US009056760B2

(12) United States Patent
Feiertag et al.

(10) Patent No.: US 9,056,760 B2
(45) Date of Patent: Jun. 16, 2015

(54) MINIATURIZED ELECTRICAL COMPONENT COMPRISING AN MEMS AND AN ASIC AND PRODUCTION METHOD

(75) Inventors: Gregor Feiertag, Munich (DE); Hans Krueger, Munich (DE); Wolfgang Pahl, Munich (DE); Anton Leidl, Hohenbrunn (DE)

(73) Assignee: Epcos AG, Munich (DE)

( * ) Notice: Subject to any disclaimer, the term of this patent is extended or adjusted under 35 U.S.C. 154(b) by 298 days.

(21) Appl. No.: 13/520,923

(22) PCT Filed: Jan. 24, 2011

(86) PCT No.: PCT/EP2011/050902
§ 371 (c)(1),
(2), (4) Date: Jul. 6, 2012

(87) PCT Pub. No.: WO2011/092137
PCT Pub. Date: Aug. 4, 2011

(65) Prior Publication Data
US 2013/0119492 A1    May 16, 2013

(30) Foreign Application Priority Data

Jan. 29, 2010   (DE) .......................... 10 2010 006 132

(51) Int. Cl.
*H01L 29/72* (2006.01)
*B81B 7/00* (2006.01)
(Continued)

(52) U.S. Cl.
CPC ....... *B81B 7/0061* (2013.01); *B81B 2201/0257* (2013.01); *B81B 2207/012* (2013.01); *B81C 1/00238* (2013.01); *G01L 9/0073* (2013.01); *H04R 19/04* (2013.01); *H01L 23/10* (2013.01);

*H01L 23/552* (2013.01); *H01L 24/13* (2013.01);
*H01L 24/16* (2013.01); *H01L 24/27* (2013.01);
*H01L 24/29* (2013.01); *H01L 24/32* (2013.01);
*H01L 24/73* (2013.01); *H01L 24/81* (2013.01);
*H01L 24/83* (2013.01); *H01L 24/94* (2013.01);
*H01L 25/0657* (2013.01);
(Continued)

(58) Field of Classification Search
CPC ...................... B81B 2201/0257; G01L 9/0042
USPC .................................................. 257/416, 419
See application file for complete search history.

(56) References Cited

U.S. PATENT DOCUMENTS 6,088,463 A    7/2000   Rombach et al.
6,522,762 B1   2/2003   Mullenborn et al.
(Continued)

FOREIGN PATENT DOCUMENTS

EP       2252077 A1    11/2010
WO    2007/054070 A1    5/2007
(Continued)

OTHER PUBLICATIONS

International Search Report corresponding to co-pending International Patent Application Serial No. PCT/EP2011/050902, European Patent Office, dated Oct. 24, 2011; (2 pages).

*Primary Examiner* — Edward Wojciechowicz
(74) *Attorney, Agent, or Firm* — Nixon Peabody LLP

(57) ABSTRACT

The invention relates to a miniaturized electrical component comprising an MEMS chip and an ASIC chip. The MEMS chip and the ASIC chip are disposed on top of each other; an internal mounting of MEMS chip and ASIC chip is connected to external electrical terminals of the electrical component by means of vias through the MEMS chip or the ASIC chip.

10 Claims, 3 Drawing Sheets

Figure 1:
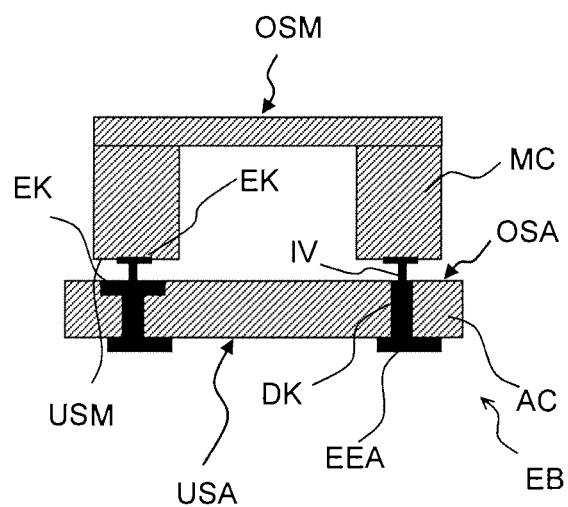

(51) Int. Cl.
  B81C 1/00  (2006.01)
  G01L 9/00  (2006.01)
  H01L 23/10  (2006.01)
  H04R 19/04  (2006.01)
  H01L 23/552  (2006.01)
  H01L 23/00  (2006.01)
  H01L 25/065  (2006.01)

(52) U.S. Cl.
  CPC .... *H01L 2224/131* (2013.01); *H01L 2224/133* (2013.01); *H01L 2224/16145* (2013.01); *H01L 2224/16146* (2013.01); *H01L 2224/29011* (2013.01); *H01L 2224/29013* (2013.01); *H01L 2224/291* (2013.01); *H01L 2224/2919* (2013.01); *H01L 2224/2929* (2013.01); *H01L 2224/293* (2013.01); *H01L 2224/32145* (2013.01); *H01L 2224/73203* (2013.01); *H01L 2224/81801* (2013.01); *H01L 2224/83825* (2013.01); *H01L 2224/8385* (2013.01); *H01L 2224/83851* (2013.01); *H01L 2224/94* (2013.01); *H01L 2924/1433* (2013.01); *H01L 2924/1461* (2013.01); *H01L 2924/163* (2013.01); *H01L 2224/27438* (2013.01); *H01L 2224/1329* (2013.01); *H01L 2224/8185* (2013.01); *H01L 2225/06513* (2013.01); *H01L 2225/06541* (2013.01); B81C 1/00309 (2013.01); *H01L 2924/01029* (2013.01); *H01L 2924/10253* (2013.01); *H01L 2924/07811* (2013.01)

(56) References Cited

U.S. PATENT DOCUMENTS

| | | | |
|---|---|---|---|
| 6,781,231 B2 | 8/2004 | Minervini | |
| 6,859,542 B2 | 2/2005 | Johannsen et al. | 381/174 |
| 7,142,682 B2 | 11/2006 | Müllenborn et al. | 381/322 |
| 7,447,323 B2 | 11/2008 | Mullenborn et al. | 381/174 |
| RE40,781 E | 6/2009 | Johannsen et al. | 381/174 |
| 7,548,626 B2 | 6/2009 | Stenberg et al. | 381/113 |
| 7,630,504 B2 | 12/2009 | Poulsen | 381/111 |
| 7,634,096 B2 | 12/2009 | Fallesen | 381/113 |
| 7,792,315 B2 | 9/2010 | Müllenborn et al. | 381/175 |
| RE42,346 E | 5/2011 | Rombach et al. | 381/174 |
| RE42,347 E | 5/2011 | Rombach et al. | 381/174 |
| 8,036,401 B2 | 10/2011 | Poulsen et al. | 381/113 |
| 8,094,846 B2 | 1/2012 | Hovesten et al. | 381/312 |
| 8,097,483 B2 | 1/2012 | Van Schaijk et al. | 438/52 |
| 8,103,025 B2 | 1/2012 | Mullenborn et al. | 381/174 |
| 8,143,967 B2 | 3/2012 | Schmidhammer | 333/17.3 |
| 8,170,249 B2 | 5/2012 | Halteren | 381/322 |
| 8,259,963 B2 | 9/2012 | Stenberg et al. | 381/113 |
| 8,284,966 B2 | 10/2012 | Wilk et al. | 381/189 |
| 8,295,528 B2 | 10/2012 | Rombach et al. | 381/369 |
| 8,305,069 B2 | 11/2012 | Bouwman et al. | 323/313 |
| 8,305,136 B2 | 11/2012 | Schmidhammer | 327/554 |
| 8,330,667 B2 | 12/2012 | Boyle | 343/750 |
| 2007/0158826 A1 | 7/2007 | Sakakibara et al. | 257/723 |
| 2008/0315333 A1 | 12/2008 | Combi et al. | 257/415 |
| 2009/0001553 A1 | 1/2009 | Pahl et al. | |
| 2009/0101998 A1* | 4/2009 | Yen et al. | 257/416 |
| 2009/0194829 A1 | 8/2009 | Chung et al. | |
| 2009/0214061 A1 | 8/2009 | Johansen et al. | 381/174 |
| 2010/0019393 A1 | 1/2010 | Hsieh et al. | |
| 2010/0159643 A1 | 6/2010 | Takahashi et al. | |
| 2010/0176895 A1 | 7/2010 | Schmidhammer | 333/32 |
| 2010/0176899 A1 | 7/2010 | Schäufele et al. | 333/187 |
| 2010/0237962 A1 | 9/2010 | Schmidhammer | 333/26 |
| 2011/0006381 A1 | 1/2011 | Feiertag et al. | 257/416 |
| 2011/0110536 A1 | 5/2011 | Hovesten et al. | 381/111 |
| 2011/0114355 A1 | 5/2011 | Bauer et al. | 174/50.5 |
| 2011/0133315 A1 | 6/2011 | Pahl et al. | 257/659 |
| 2011/0170714 A1 | 7/2011 | Hanzlik et al. | 381/111 |
| 2011/0180885 A1 | 7/2011 | Pahl et al. | 257/415 |
| 2011/0230068 A1 | 9/2011 | Pahl | 439/65 |
| 2011/0233690 A1 | 9/2011 | Feiertag et al. | 257/414 |
| 2011/0298064 A1 | 12/2011 | Pahl et al. | 257/415 |
| 2012/0093346 A1 | 4/2012 | Feiertag et al. | 381/174 |
| 2012/0224726 A1 | 9/2012 | Pahl | 381/174 |
| 2012/0225259 A1 | 9/2012 | Mortensen et al. | 428/195.1 |
| 2012/0235735 A1 | 9/2012 | Spits et al. | 330/126 |
| 2012/0275634 A1 | 11/2012 | Leidl et al. | 381/369 |
| 2012/0299131 A1 | 11/2012 | Henn | 257/416 |
| 2012/0326249 A1 | 12/2012 | Rombach | 257/416 |

FOREIGN PATENT DOCUMENTS

| | | | |
|---|---|---|---|
| WO | 2011/092137 | 8/2011 | B81C 1/00 |
| WO | 2011/107159 | 9/2011 | H03F 3/193 |
| WO | 2011/144570 | 11/2011 | H04R 19/00 |

* cited by examiner

MINIATURIZED ELECTRICAL COMPONENT COMPRISING AN MEMS AND AN ASIC AND PRODUCTION METHOD

CROSS-REFERENCE TO RELATED APPLICATIONS

This application is a U.S. National Stage of International Application No. PCT/EP2011/050902, filed Jan. 24, 2011, which claims the benefit of Germany Patent Application No. 102010006132.8, filed on Jan. 29, 2010, both of which are incorporated herein by reference in their entireties.

The invention relates to miniaturized MEMS sensor components comprising an MEMS chip and an ASIC chip.

MEMS (Micro-Electro-Mechanical Systems) are employed as sensors in many cases. It is e.g. possible to use MEMS as moisture sensors, inertial sensors—such as e.g. acceleration sensors—, pressure sensors or microphone sensors.

ASICs (Application Specific Integrated Circuits) generally comprise, if they are interconnected with MEMS sensors, the circuits, e.g. logic circuits or analog circuits, for evaluating the sensor signals made available by the MEMS. If an MEMS microphone comprises two capacitor electrodes, for example, the distance between which changes with the pressure fluctuations of a received acoustic sound wave, then the ASIC can comprise analog or digital circuits which convert the temporally variable capacitance of the MEMS capacitor into signals that can be electronically processed further. An MEMS microphone is obtained in this way.

The patent specification U.S. Pat. No. 6,781,231 B2 discloses an MEMS microphone wherein the MEMS chip is mounted on a substrate and encapsulated with a cap-like covering.

The patent specification U.S. Pat. No. 6,522,762 B1 discloses an MEMS microphone wherein an MEMS chip and an ASIC chip are mounted alongside one another on one side of a carrier substrate.

The patent specification U.S. Pat. No. 6,088,463 discloses an MEMS microphone wherein an MEMS chip comprising silicon and an ASIC chip are mounted on opposite sides of a carrier substrate ("intermediate layer").

The published patent application US 2009/0001553 A1 discloses an MEMS package wherein an MEMS chip and an ASIC chip are mounted alongside one another or one above the other and are covered with a metallic layer.

All of the electrical components mentioned above require a carrier substrate on which they have to be mounted.

The market for electronic components and in particular for MEMS components which can be used in mobile electronic devices, for example, demands components that are miniaturized to an ever greater extent, in order to be able to integrate ever more functions into the mobile devices (e.g. mobile communication devices).

One object of the present invention is to specify an electronic MEMS sensor component having a small structural size which can be produced in an expedient manner and has an improved signal resolution. A further object consists in specifying a production method.

The present invention specifies an MEMS sensor component, comprising an MEMS chip having an electrical contact and an ASIC chip having an electrical contact. The component furthermore comprises an internal interconnection of MEMS chip and ASIC chip and an external electrical terminal. The electrical component furthermore comprises a plated-through hole through the MEMS chip or through the ASIC chip. In this case, the MEMS chip and the ASIC chip are arranged one above another. The internal interconnection comprises a direct interconnection of the electrical contact of the MEMS chip with the electrical contact of the ASIC chip. The internal interconnection or at least one of the electrical contacts of the chips is interconnected with the external electrical terminal via the plated-through hole.

The plated-through hole is interconnected with an external electrical terminal of the component which is arranged on that side of the ASIC chip which faces away from the MEMS chip or on that side of the MEMS chip which faces away from the ASIC chip. A gap is arranged between the MEMS chip and the ASIC chip and a frame that seals the interior of the MEMS sensor component in a lateral direction is arranged in said gap. The MEMS chip comprises at least one sensor electrode, which can comprise a movable electrode and a fixed electrode. A sensor opening is arranged directly in the ASIC chip or leads through the ASIC chip, or leads from the side into the gap arranged in the space between MEMS chip and ASIC chip. The sensor opening serves for passage of the measurement variable to be evaluated (e.g. sound energy, pressure, gas, moisture) from the surroundings into the interior of the component.

Plated-through holes in silicon chips can be, for example, so-called TSVs (through-silicon vias).

Such an electrical MEMS sensor component, by virtue of the fact that the MEMS chip and the ASIC chip are arranged one above the other, has a small structural size. In particular, the area requirement of the component is substantially not greater than the area requirement of the larger of the MEMS chip or the ASIC chip.

A multiplicity of identical MEMS chips can be produced on a first wafer, while a multiplicity of identical ASIC chips can be produced on a second wafer. After the production of the respective wafers, the multiplicity of MEMS chips can be connected to the multiplicity of ASIC chips such that a respective MEMS chip is connected to a respective ASIC chip. Such manufacture in a multiple panel according to the gang-run printing principle enables simple and cost-effective production of the electrical components.

However, it is also possible for only one type selected from ASIC chips and MEMS chips to be present on a common wafer, that is to say in a multiple panel, and then to be connected to singulated chips of the respective other type.

By virtue of the fact that the MEMS chip and the ASIC chip are arranged one above the other and are directly interconnected with one another via plated-through holes through the MEMS chip or through the ASIC chip, the electrical lines are made as short as possible. This is advantageous since a signal which is detected by the MEMS chip and which is conducted via the internal interconnection to the ASIC chip generally has all the more and all the greater disturbances, the longer the electrical connection from the MEMS chip to the ASIC chip. Short electrical lines therefore enable a signal contaminated with disturbances to a lesser extent.

Compared with known electrical components, therefore, the present invention specifies distinctly improved components.

In one embodiment, the MEMS chip has an underside. The ASIC chip has a top side and an underside. The top side of the ASIC chip faces the underside of the MEMS chip.

The plated-through hole runs through the ASIC chip. The external electrical terminal is arranged on the underside of the ASIC chip.

It is also possible to provide the external electrical terminal on the underside of the MEMS chip and to arrange the ASIC chip on the top side of the MEMS chip.

For connecting the external electrical terminal to the component structures of the MEMS chip or the component structures of the ASIC chip, a plated-through hole is provided through that one of the two chips which carries the external electrical terminals.

Component structures of the MEMS chip and circuits of the ASIC chip can be arranged either on the top side of the chips or on the underside of the chips. However, component structures of the MEMS chip and circuits of the ASIC chip can also be arranged in the interior of the respective chips. Corresponding plated-through holes ensure that electrical connections between electrical circuit components or component structures run along short paths.

The electrical component comprising an MEMS chip and an ASIC chip does not rely on being arranged on a carrier substrate or component carrier provided especially for it. The electrical component comprises an external contact enabling it to be integrated into an arbitrary external circuit environment.

In particular, there is no need for a carrier substrate that supports the function of the MEMS chip (e.g. by providing an acoustic back volume) or of the ASIC chip (e.g. by means of integrated further circuits).

In one embodiment, the substrate of the MEMS chip or the substrate of the ASIC chip comprises silicon.

Silicon is an element which can be produced with high purity and in monocrystalline fashion and the production and processing of which is given by the extensive wealth of experience of semiconductor technology. Methods known from semiconductor technology therefore allow reliable processing and production of the MEMS chip and/or of the ASIC chip.

In one embodiment, the electrical contact of the MEMS chip is soldered to the electrical contact of the ASIC chip. Alternatively, adhesive bonding by means of an electrically conductive plastic, an interconnection by means of bonding connections or welding together of the chips is possible.

When electrically conductive adhesive is used, it is possible to use an anisotropically conductive adhesive. In that case, with this adhesive, which can be applied over a large area onto one of the mutually facing sides of the chips or in structured fashion e.g. in the form of an adhesive frame, it is possible to realize both a sealing of the gap between MEMS chip and ASIC chip toward the outside and an electrical contact-connection between the chips.

In one embodiment, a gap is arranged between the chips. The gap can be hermetically or acoustically sealed by a ring-shaped frame, e.g. by the adhesive frame or some other sealing ring. In that case, the ring-shaped frame consisting e.g. of plastic, glass, ceramic or metal can, together with the upper and the lower chip, enclose a cavity between the upper and the lower chip and form a ring-shaped closure. Component structures of the MEMS chip or circuit elements of the ASIC chip can be arranged in the cavity.

A sealing of the electrical MEMS sensor component can also be produced after the two chips have been connected. The ring-shaped closure can be effected, for example, by laminating a film over the smaller of the chips or by applying a polymer material in the same place. The two chips can be connected to and interconnected with one another in flip-chip design.

The sealing can also be effected by laminating a film over the upper of the chips or by applying a polymer material in the same place, e.g. when both chips have the same lateral dimensions.

The frame can be a structured polymer frame. The frame can be arranged before the pairwise combination of the chips on the MEMS chip or on the ASIC chip or in parts on both chips and seal a gap between the chips after the connection of the chips toward the outside. If the wafer level is implied, the polymer frame can also be provided already on one or both wafers.

The frame can comprise the same material as the electrical interconnections of the chips. In particular, the frame can comprise a soldering, a so-called solid-liquid interdiffusion soldering, an electrically conductive adhesive or two metal partial frames which are distributed between the two chips and which are bonded together under the action of pressure and temperature.

Component structures of the MEMS chip can be encapsulated against external influences. In that case, they are protected, for example, against contaminants during production, e.g. the soldering or interconnection or connection on a circuit board/mounting plate or during combination with the ASIC chip.

An encapsulation of the component or a sealing of the gap between MEMS chip and ASIC chip toward the outside can comprise a film which covers the top side and lateral areas of the upper chip and, e.g. bearing in a manner closed all round, terminates tightly with the top side or the lateral areas of the lower chip. Such a film can comprise an, e.g. already partly crosslinked, epoxy resin or a B-stage material. Such a film can additionally be covered partly or completely with a metallization layer.

Instead of said film or supplementarily for electrical insulation before said metallization is applied, a dielectric layer can be applied, e.g. by spraying of resist or vapor deposition of oxides, nitrides or polymers such as e.g. parylenes.

In one embodiment, the component is arranged on the top side of a mounting plate having an electrical terminal. The external electrical terminal of the component is interconnected with the electrical terminal of the mounting plate. Said mounting plate can be an arbitrary mounting plate of an external circuit environment. The mounting plate is not absolutely necessary for the functionality of the electrical component.

The MEMS chip or the ASIC chip can comprise contact pads on the underside, e.g. for contact-connection to a mounting plate.

In one embodiment, the MEMS chip comprises a cavity, a movable membrane provided with an electrode, said membrane closing off the cavity at one side, and a counterelectrode, which is preferably arranged parallel to the membrane and which is arranged on that side of the membrane which faces away from the cavity. The movable membrane together with the counterelectrode forms a capacitive element. The ASIC chip comprises a circuit for determining the capacitance or for ascertaining capacitance changes of the capacitive element. Such an electrical component can constitute an MEMS microphone. The movable membrane reacts to the temporally varying air pressure of a received sound wave. By virtue of the fact that the distance between the counterelectrode and the membrane changes with the frequency of the arriving sound waves, the distance-dependent capacitance of the capacitive element codes the tone transmitted by sound.

The ASIC chip can comprise a circuit which, at the two electrodes of the capacitive element, e.g. by means of a resistor having a high resistance and a charge pump, keeps substantially constant the electrical charge stored in the capacitive element and thus generates a BIAS voltage. A further circuit of the ASIC chip can detect the temporally variable voltage dropped across the capacitive element and convert it into a digital signal by means of an analog-to-digital converter. The digital signal can be made available for example at the external electrical terminal of the electrical component for an external circuit environment.

In this case, the counterelectrode of the MEMS chip can be arranged between the ASIC chip and the membrane. It is also possible for the membrane to be arranged between the ASIC chip and the counterelectrode.

The membrane is connected to the surroundings via the sensor opening.

In one embodiment, the MEMS chip has component structures for determining air pressure, moisture or the composition of a gas. The component structures are in contact with the atmosphere surrounding the component. An electrical component for determining the air pressure can comprise, for example, a closed cavity having a defined internal pressure. The closed cavity is surrounded by a wall that is elastically deformable at least in one section. If the air pressure of the atmosphere surrounding the electrical component changes, then the elastic wall reacts, on account of the different force ratios on the inside and on the outside, to the excess or reduced pressure of the cavity by an elastic deformation. Such an elastic deformation of the elastic wall can be detected, for example, by means of a resistance structure fitted on the elastic wall or a change in the electrical resistance thereof. Thus, changes in air pressure which correspond to a difference in altitude—at sea level—of approximately one decimeter can be measured with the component.

An electrical component according to the invention can also be configured as a gas sensor.

Each of the two chips or both chips or the entire electrical component can comprise an outer metallization for protection, for electromagnetic shielding or for hermetic encapsulation. Such a metallization affords protection for example against mechanical damage or incident RF radiation. The metallization can be applied by lamination of a film and by sputtering or electrolytically.

It may be necessary to electrically insulate this shielding metallization from the chip body.

Nevertheless, the shielding metallization is very generally connected in a defined manner to a suitable potential (e.g. ground) of the arrangement or an external terminal.

In one exemplary embodiment, the smaller of the two chips can be enlarged in terms of its geometrical design, e.g. in terms of its lateral dimensions or in terms of its volume, by means of a molding process. For this purpose, the chips are adhesively bonded e.g. in a grid-shaped arrangement onto a film and regions between the chips are filled with a molding compound. The new wafer thus produced is then provided with plated-through holes and a wiring plane. This "enlarged" wafer is then used in one of the process sequences specified above.

In the case of such an enlargement of chips, in the first step, a new wafer can be produced virtually by molding from individual chips arranged in the panel. In subsequent steps, plated-through holes or openings, e.g. sound openings, can also be arranged in the region of the molding compound. Plated-through holes or openings can alternatively also already be produced during molding and cut out e.g. by means of the arrangement of pins in the mold. In this case, the enlarged dimensions facilitate the arrangement of such openings, plated-through holes or additional wirings on or at the respective chip.

In a similar embodiment, the new multiple panel is obtained by laminating the ASIC chips into an organic circuit board, which in turn contains plated-through holes and wiring structures.

It is also possible, for a single component, to mount a plurality of MEMS chips on one ASIC chip or a plurality of ASIC chips on one MEMS chip.

The material of MEMS chip and ASIC chip can be chosen such that mechanical stresses between the chips which load the mechanical connection between the chips or the electrical interconnection between the chips are reduced. In particular, it can be provided that the substrate of the MEMS chip and the substrate of the ASIC chip comprise the same material.

In one embodiment, the electrical component is embodied as a microphone. A gap remains between the MEMS chip and the ASIC chip. A frame that is closed in a ring-shaped manner and acoustically seals off the interior of the component is arranged in the gap. The MEMS chip comprises a counterelectrode and a membrane. A sound entry opening is arranged in the ASIC chip or in the frame. The MEMS chip and the ASIC chip can have the same lateral dimensions. The external electrical terminal is arranged on that side of the ASIC chip which faces away from the MEMS chip. The MEMS chip, the ASIC chip and preferably also the frame then terminate flush with one another in a lateral direction at the microphone.

Alongside the one sound entry opening in the ASIC chip or in the frame, further sound entry openings, e.g. each having a diameter of approximately 30 µm, can be arranged. A multiplicity of smaller openings enables a good sound entry with improved protection against dirt particles.

A method for producing an electrical component comprises the following steps:
 providing an ASIC chip having an electrical contact and an MEMS chip having an electrical contact,
 producing a plated-through hole through the MEMS chip or through the ASIC chip,
 arranging the ASIC chip and the MEMS chip one above another,
 connecting ASIC chip and MEMS chip,
 interconnecting the electrical contacts of the ASIC chip and of the MEMS chip,
 providing a sensor opening in the ASIC chip or between ASIC chip and MEMS chip.

In one embodiment of the method, the ASIC chip or the MEMS chip is made available in a multiple panel on a wafer and connected to singulated second chips. In particular the manufacture suitable for mass production by means of wafers makes it possible to produce electrical components according to the invention efficiently, simply and cost-effectively.

In one embodiment, the ASIC chip and the MEMS chip are in each case made available in multiple panels on a respective wafer. The wafers are joined together such that a respective ASIC chip is connected to and interconnected with a respective MEMS chip. The singulation of the electrical components can be effected after the joining together and interconnection, e.g. by means of a laser or by means of sawing methods.

In one embodiment, an opening, e.g. a sound entry opening, is etched through the ASIC chip. It is also possible to etch a corresponding multiplicity of smaller openings instead of one large opening. In this case, the etching of smaller openings can have advantages in respect of method engineering. One or a plurality of sensor openings in the frame can be produced during the production of the frame directly or afterward by structuring. If the frame consists of two partial frames distributed between the mutually facing surfaces of the two chips, a sensor opening can also be provided only in one of the two partial frames.

In addition, strains in the MEMS chip, in the ASIC chip or between the chips can be reduced by the use of flexible fixings and/or interconnections. In particular polymer bumps with spiral copper lines, ACA connections (Anisotropic Conductive Adhesive connections) or flexible ICA connections (Isotropic Conductive Adhesive connections) are appropriate for this purpose.

If a chip of the electrical component is connected to a mounting plate, then measures for reducing mechanical stress loads can likewise be implemented on that side of the corresponding chip of the component which faces the mounting plate. In particular, a highly flexible polymer layer having a CTE (CTE=coefficient of thermal expansion) adapted to a mounting plate or a low modulus of elasticity in the relevant temperature range can be applied on that side of the component which faces the mounting plate. LGA (land grid array) or BGA (ball grid array) connections are appropriate as connection and interconnection between the chips or between the component and a mounting plate. Said connections can be configured in flexible fashion.

An ASIC chip can comprise a charge pump in order to enable higher voltages than that of the supply voltage. In particular the voltage with which the capacitive element of an MEMS microphone is charged, with approximately ten volts, is significantly above customary operating voltages and can be generated in the ASIC.

Plated-through holes through the MEMS chip or through the ASIC chip make it possible to arrange and interconnect component structures or integrated circuits at any desired and simultaneously at different locations of the chips. The degree of freedom in designing the electrical component is thus significantly increased.

The electrical component is explained in greater detail below on the basis of exemplary embodiments and associated schematic figures.

Figure 2:
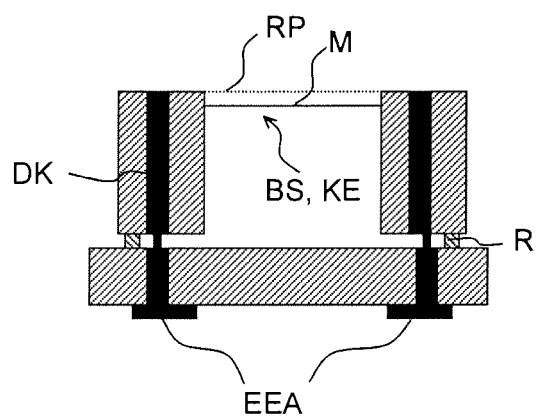
Figure 3:
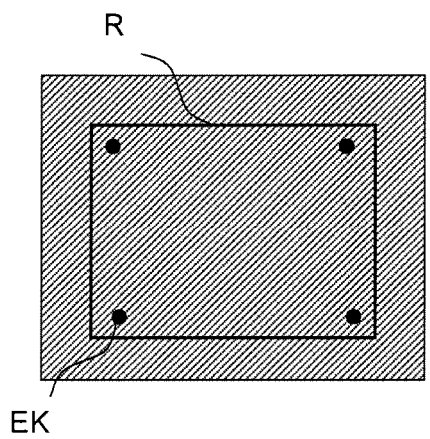
Figure 4:
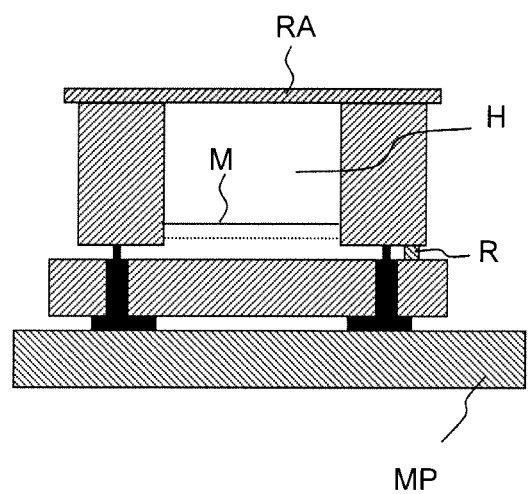
Figure 5:
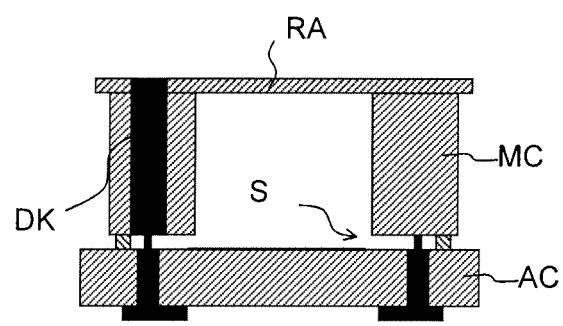
Figure 6:
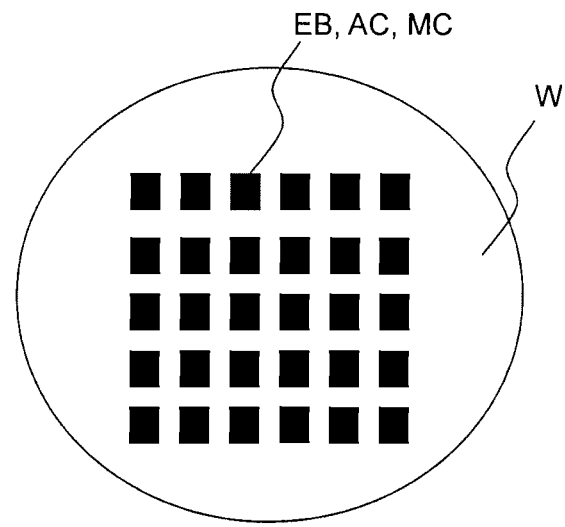
Figure 7:
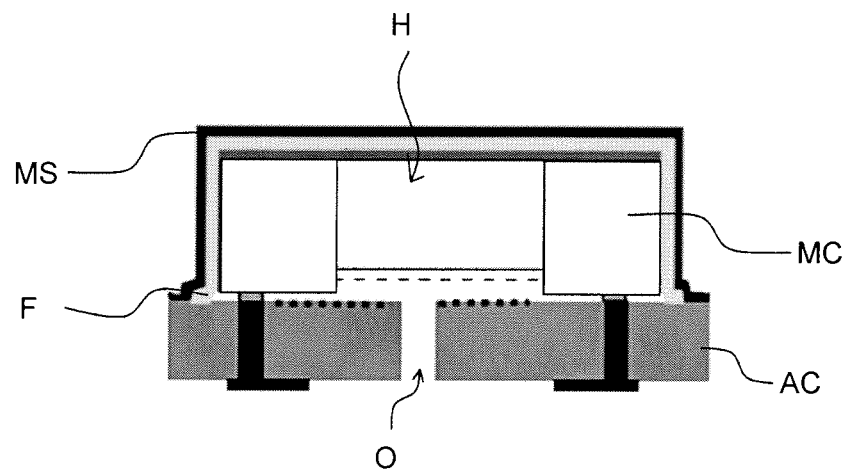
Figure 8:
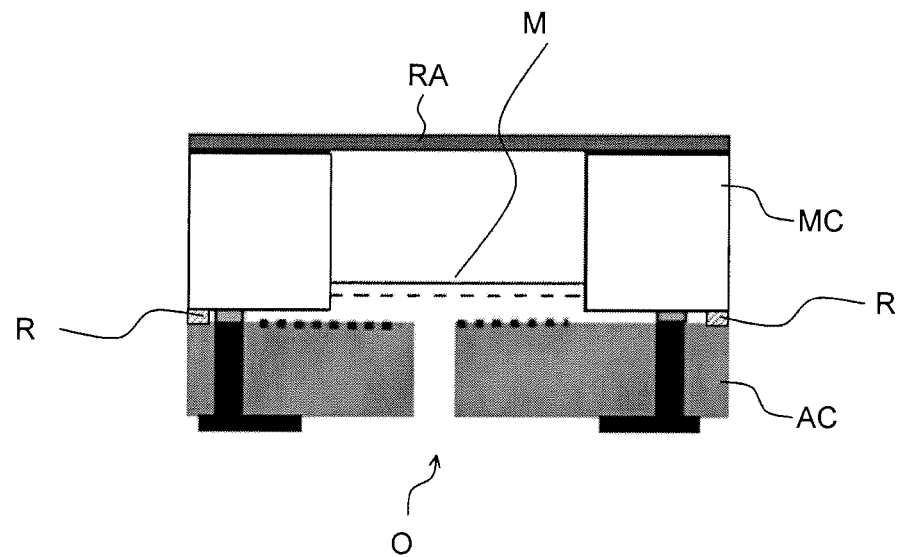

In the figures:

FIG. 1 shows an electrical component comprising an MEMS chip and an ASIC chip,

FIG. 2 shows an electrical component comprising a counterelectrode and a membrane as component structure, FIG. 3 shows the basic contour of an electrical component comprising a frame enclosing electrical contacts, FIG. 4 shows an electrical component arranged on a mounting plate, FIG. 5 shows an electrical component whose MEMS chip comprises a cover or an elastic wall, FIG. 6 shows a wafer on which electrical components, ASIC chips or MEMS chips are arranged, FIG. 7 shows an electrical component comprising a film covering the upper chip, FIG. 8 shows a component comprising an opening arranged in the ASIC chip.

FIG. 1 shows an electrical MEMS sensor component EB comprising an MEMS chip MC and an ASIC chip AC. The MEMS chip MC has a top side OSM and an underside USM. In this and the following exemplary embodiments, the term underside always denotes the side into which the external electrical terminals EEA of the component face, which are situated at the underside of the lower chip in the figure. The ASIC chip AC likewise has a top side OSA and an underside USA. The MEMS chip MC is arranged on the ASIC chip in such a way that the underside USM of the MEMS chip MC faces the top side OSA of the ASIC chip AC. The MEMS chip MC comprises electrical contacts EK arranged at its underside. The ASIC chip comprises electrical contacts EK arranged at its top side OSA. The electrical contacts at the underside of the MEMS chip are interconnected with the electrical contacts at the top side of the ASIC chip and constitute at least a portion of the integrated interconnections IV of the electrical component EB.

Here and also in the remaining exemplary embodiments, the component structures of the ASIC can lie on the side with the external electrical terminal contacts EEA or—preferably—on the side facing the MEMS chip.

Plated-through holes DK are arranged in the interior of the ASIC chip AC and interconnect one or a plurality of the electrical contacts or the internal interconnection with external electrical terminals EEA arranged at the underside of the ASIC chip. The component EB can comprise one or a plurality of electrical external terminals. Via said one or said plurality of electrical terminals, the component EB can be interconnected with an external circuit environment (not shown here).

The electrical contacts EK of the MEMS chip MC and of the ASIC chip AC are interconnected with one another on the shortest possible path. The susceptibility of the electrical component to interference is thereby reduced. Moreover, a compact electrical component having a small structural size is obtained by the specified arrangement and interconnection of MEMS chip MC and ASIC chip AC.

FIG. 2 shows a configuration of the electrical component comprising a counterelectrode RP, also referred to as backplate, and a membrane M as component structures BS. This embodiment furthermore comprises plated-through holes DK through the MEMS chip, such that the component structures BS of the MEMS chip, which are arranged at the top side thereof, are interconnected via an internal interconnection and via plated-through holes through the ASIC chip with electrical external terminals EEA of the component at the underside of the ASIC chip.

A gap is arranged between the MEMS chip MC and the ASIC chip AC, the height of which gap substantially determines the distance between MEMS component and ASIC chip. A frame R closed in a ring-shaped fashion encloses the gap between the chips. If, for example, the counterelectrode RP and the membrane M constitute the two electrodes of the capacitive element of an MEMS microphone, then the frame R forms a hermetically sealed back volume in the interior of the MEMS chip and between the MEMS chip and the ASIC chip.

The MEMS chip comprises, as component structures BS, a movable membrane M and a backplate as counterelectrode RP, which together form a capacitive element KE of a microphone.

FIG. 3 shows a cross section parallel to the top side of the ASIC chip through an electrical component wherein a frame R encloses electrical contacts EK, which are part of the inner interconnection of the electrical component, in a ring-shaped fashion. In this case, the term "in a ring-shaped fashion" does not refer to the geometrical shape of the frame. Rather, the term "in a ring-shaped fashion" relates to a closed curve.

FIG. 4 illustrates an electrical component which is arranged on a mounting plate MP and is interconnected with electrical contacts on the surface of the mounting plate. Such an arrangement represents a possibility for interconnecting the electrical component with an external interconnection.

A cavity H is arranged in the interior of the MEMS chip. Component structures, e.g. a membrane M, are arranged in a manner delimiting the cavity H on one side. On the other side, the cavity of the microphone is covered with a rear-side covering RA, for example a PI film. However, the rear-side covering can also be a plate, e.g. composed of ceramic, silicon, metal or glass.

A not completely closed frame is arranged between the upper chip and the lower chip. A cross section through the frame is shown on the right. A section of the frame is absent on the left, such that a sensor opening, e.g. a sound entry opening, is formed there. Sound can thus pass between the electrical connections between the chips into the interior of the component or into the space between the two chips. An electrical component comprising a lateral sensor opening (e.g. as sound entry) is thus formed.

FIG. 5 shows an electrical component wherein a gap S is arranged between the MEMS chip MC and the ASIC chip AC. A plated-through hole DK leads not only through the MEMS chip but also through the rear-side covering RA of the MEMS chip MC. Said covering can be elastically deformable and comprise electrical resistance elements whose electrical resistance is dependent on the deformation of the rear-side covering RA. Said resistance elements can be applied on the top side of the cover or implanted into the top side of the cover. The plated-through hole DK leads through the cover and can thus interconnect the resistance elements with the internal interconnection.

FIG. 6 shows a wafer W, on the top side of which a multiplicity of electrical components, ASIC chips AC or MEMS chips MC are arranged alongside one another. The electrical components, ASIC chips or MEMS chips can be mounted on the wafer or produced jointly in parallel and integrated in the wafer. The individual chips can be produced simultaneously in high numbers. A wafer comprising ASIC chips, after its production, can be connected to a wafer comprising produced MEMS chips MC in such a way that exactly one respective ASIC chip is connected to and interconnected with exactly one respective MEMS chip. The individual chips can be singulated before or after their connection to the respective other chip. It is advantageous firstly to connect the wafers to the other chips and then to singulate the completed electrical components.

FIG. 7 shows an embodiment wherein the upper chip MC comprises an encapsulation by a film F and a metallization layer MS. The film covers the top side and lateral areas of the upper chip. It terminates tightly with a region of the top side or the lateral areas of the lower chip. It can be produced by lamination. The cavity in the MEMS chip can be closed off by the rear-side covering before lamination, in order to prevent the laminating film from penetrating into the cavity H during lamination. The encapsulation seals a gap arranged between the chips hermetically or at least acoustically toward the outside. Such a sealing can be effected after the connection of the two chips.

In the embodiment illustrated, the sensor opening O is provided through the ASIC wafer. However, it is also possible to provide the sensor opening in the encapsulation through the film F and the metallization layer MS, and in particular to produce it subsequently. A frame R can be provided between the two chips, which frame R determines the distance between the two chips and therefore, inter alia, also the volume enclosed between the two chips.

FIG. 8 shows a configuration of the electrical component as a microphone, wherein the MEMS chip MC is arranged above the ASIC chip AC. A gap is arranged between the chips MC, AC. A frame R that at least acoustically seals the interior of the component in a lateral direction is arranged in the gap. Component structures of the MEMS chip comprise a perforated counterelectrode (backplate) and a membrane. An opening O leads through the ASIC chip and constitutes a sound entry opening. Digital and/or analog circuits are arranged on the top side of the ASIC chip and are interconnected with the component structures of the MEMS chip.

The MEMS chip, the ASIC chip and, if appropriate, also the frame arranged therebetween are arranged flush in a lateral direction. Such "smooth" side walls are obtained e.g. by virtue of the fact that a multiplicity of MEMS chips and a multiplicity of ASIC chips are in each case produced in a multiple panel and are subsequently connected to and interconnected with one another before the individual components are singulated, e.g. by sawing. This embodiment, too, can additionally be provided with a shielding metal layer and, if appropriate, insulation layer arranged underneath.

An electrical component is not restricted to one of the exemplary embodiments described. Variations encompassing e.g. even further chips or other component structures or electrical contacts or any desired combinations thereof likewise constitute exemplary embodiments according to the invention.

LIST OF REFERENCE SYMBOLS

BS Component structures
RA Rear-side covering
DK Plated-through hole
EB MEMS sensor component
EEA External electrical terminal
EK Electrical contact
IC Integrated circuits
IV Internal interconnection
KE Capacitive element
M Membrane
MC MEMS chip
MP Mounting plate
O Opening
OSM, OSA Top side of MEMS chip and ASIC chip
R Frame
RP Counterelectrode (Backplate)
S Gap
H Cavity
W Wafer

The invention claimed is:

1. An MEMS microphone component, comprising
an MEMS chip having an electrical contact,
an ASIC chip having an electrical contact,
an internal interconnection of MEMS chip and ASIC chip, and
a plated-through hole through the MEMS chip or through the ASIC chip, wherein
the MEMS chip and the ASIC chip are arranged one above another,
the internal interconnection comprises a direct interconnection of the electrical contact of the MEMS chip with the electrical contact of the ASIC chip,
the internal interconnection or at least one of the electrical contacts of the chips is interconnected via the plated-through hole with an external electrical terminal of the component which is arranged on that side of the ASIC chip which faces away from the MEMS chip or on that side of the MEMS chip which faces away from the ASIC chip,
a gap is arranged between the MEMS chip and the ASIC chip,
a frame arranged in the gap and partially enclosing a space between the MEMS chip and the ASIC chip,
the MEMS chip comprises a sensor electrode, and
the frame is not completely closed and a sound entry opening is formed at a position where a section of the frame is absent.

2. The component according to claim 1, wherein
the MEMS chip has an underside and the ASIC chip has a top side and an underside,
the top side of the ASIC chip faces the underside of the MEMS chip, the plated-through hole runs through the ASIC chip, and
the external electrical terminal is arranged on the underside of the ASIC chip.

3. The component according to claim 1, wherein
the ASIC chip has an underside and the MEMS chip has a top side and an underside,
the top side of the MEMS chip faces the underside of the ASIC chip,
the plated-through hole runs through the MEMS chip, and
the external electrical terminal is arranged on the underside of the MEMS chip.

4. The component according to claim 1, wherein the substrate of the MEMS chip or of the ASIC chip comprises silicon.

5. The component according to claim 1, wherein the electrical contact of the MEMS chip is soldered to, adhesively bonded to by an electrically conductive adhesive, interconnected with by means of a bonding connection, or welded together with, the electrical contact of the ASIC chip.

6. The component according to claim 1, wherein
the component is arranged on the top side of a mounting plate with an electrical terminal, and
the external electrical terminal is interconnected with the electrical terminal of the mounting plate.

7. The component according to claim 1, wherein
the MEMS chip comprises a cavity, a movable membrane, a counterelectrode and an opening to the cavity,
the movable membrane is arranged parallel to the counterelectrode and forms with the latter a capacitive element, and
the ASIC chip comprises a circuit for determining the capacitance or for determining capacitance changes of the capacitive element.

8. The component according to claim 1,
wherein the MEMS chip has component structures for determining air pressure, moisture or gas composition, and
wherein the component structures are in contact with the atmosphere surrounding the component.

9. The component according to claim 1, wherein at least two of MEMS chip, ASIC chip and frame terminate flush in a lateral direction.

10. The component according to claim 1, wherein
the MEMS chip comprises a fixed electrode as counterelectrode and a membrane.

* * * * *